United States Patent [19]

Sayigh et al.

[11] 3,854,946

[45] Dec. 17, 1974

[54] PROCESS FOR CHEMICALLY BONDING A DYESTUFF TO A POLYMERIC SUBSTRATE

[75] Inventors: Adnan A. R. Sayigh; Fred A. Stuber, both of North Haven; Henri Ulrich, North Branford, all of Conn.

[73] Assignee: The Upjohn Company, Kalamazoo, Mich.

[22] Filed: Sept. 14, 1973

[21] Appl. No.: 397,230

Related U.S. Application Data

[60] Division of Ser. No. 93,446, Nov. 27, 1970, Pat. No. 3,784,527, which is a continuation-in-part of Ser. No. 15,852, March 2, 1970, abandoned.

[52] U.S. Cl. .................................. 96/35.1, 8/2, 8/31, 8/DIG. 7, 96/36.2, 96/91 N, 96/115 R, 117/93.31, 117/138.8 E, 204/159.14

[51] Int. Cl. ............................ G03c 1/70, G03c 5/16

[58] Field of Search ............... 96/39.1, 91 N, 115 R; 204/159.14; 117/93.31, 138.8 E; 8/2, 31, DIG. 7

[56] References Cited

UNITED STATES PATENTS

| | | | |
|---|---|---|---|
| 2,948,610 | 8/1960 | Merrill et al. | 96/33 |
| 3,462,268 | 8/1969 | Danhauser et al. | 96/35.1 |
| 3,467,518 | 9/1969 | Laridon et al. | 96/35.1 |
| 3,699,080 | 10/1972 | Sayigh et al. | 260/47 CZ |
| 3,734,844 | 5/1973 | Sayigh et al. | 204/159.14 |

*Primary Examiner*—Ronald H. Smith
*Attorney, Agent, or Firm*—Denis A. Firth; John Kekich

[57] ABSTRACT

Radiation (thermal and light)-sensitive polymers are provided which are characterized by the recurring unit of the formula:

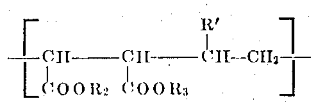

wherein R′ is lower-alkoxy or phenyl; one of $R_2$ and $R_3$ is hydrogen and the other is

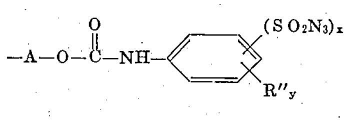

wherein A = alkylene from 2 to 10 carbon atoms having 2 to 6 carbon atoms between valencies, R″ = lower-alkyl or halogen, $x$ is 1 to 2, $y$ is 0 to 2, and $x + y$ = 1 to 3. Water soluble salts also disclosed. The polymers are useful for chemically bonding basic dyestuffs to non-dyereceptive substrates (e.g. polyethylene) by coating the substrate with radiation sensitive polymer and exposing the coated substrate to irradiation. The treated substrate is then contacted with a basic dyestuff which bonds thereto via the free carboxylic groups in the coating. The irradiation can be carried out imagewise to produce an appropriate image on the substrate which image is developed by dissolving out unexposed radiation-sensitive polymer prior to application of the dye. Bonding of the radiation-sensitive polymers of the invention to substrates in the above manner can also be employed as a means of rendering hydrophilic a variety of substrates which are hydrophobic.

12 Claims, No Drawings

PROCESS FOR CHEMICALLY BONDING A DYESTUFF TO A POLYMERIC SUBSTRATE

CROSS-REFERENCE TO RELATED APPLICATIONS

This application is a division of application Ser. No 93,446, filed Nov. 27, 1970, now Pat. No. 3,784,527 which latter is a continuation-in-part of our copending application Ser. No. 15,852, filed Mar. 2, 1970, now abandoned.

BACKGROUND OF THE INVENTION

1. Field of the Invention

This invention relates to novel radiation-sensitive polymers and is more particularly concerned with radiation-sensitive polymers having free carboxy and azidosulfonyl carbanilylalkoxycarbonyl moieties in the recurring unit thereof and with salts thereof, and with the use of said polymers to produce continuous tone images without the use of silver and/or to modify the properties of substrates which are normally hydrophobic and/or not receptive to basic dyestuffs.

2. Description of the Prior Art

So far as is known, the polymers of the invention are novel and are not analogous to any polymers hitherto known in the art. The use of the polymers of the invention in the production of continuous tone images, and in rendering the surface of substrates hydrophilic and receptive to chemical bonding with basic dyestuffs, is also believed to be novel and not analogous to processes hitherto known in the art.

SUMMARY OF THE INVENTION

The present invention comprises a radiation-sensitive polymer characterized by the recurring unit:

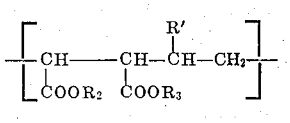
(I)

wherein R′ is selected from the class consisting of lower-alkoxy and phenyl, and wherein one of $R_2$ and $R_3$ represents hydrogen and the other of $R_2$ and $R_3$ represents a group having the formula:

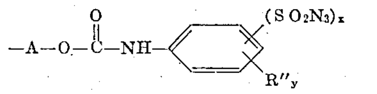

wherein A is alkylene having from 2 to 6 carbon atoms separating the valencies and a total carbon atom content of from 2 to 10, R″ is selected from the class consisting of lower-alkyl and halogen, $x$ is an integer from 1 to 2, $y$ is an integer from 0 to 2, provided that $x + y$ is not greater than 3, and the $SO_2N_3$ group is in any of positions 3, 4, and 5 in the phenyl nucleus to which it is attached and at least one of the said positions 3, 4, and 5 is unsubstituted.

The invention also comprises the salts of the above polymers with alkali metals, alkaline earth metals, ammonia and tertiary organic amines.

The invention also comprises a process for chemically bonding a basic dye to a polymer substrate which is not normally receptive to dyestuffs, said process comprising applying a radiation-sensitive polymer, as defined above, to said polymer substrate, exposing the treated substrate to radiation which activates the radiation-sensitive polymer and effects bonding between the radiation-sensitive polymer and the substrate, and then contacting the exposed, treated substrate with a basic dye.

The term "alkylene having from 2 to 6 carbon atoms separating the valencies and a total carbon atom content from 2 to 10" means a divalent aliphatic hydrocarbon radical having the stated carbon atom content in the chain separating the valencies and overall. Illustrative of such radicals are ethylene, 1,2-propylene, 1,3-propylene, 1,4-butylene, 1,2-pentylene, 1,3-hexylene, 2,2-dimethyl-1,3-propylene, 2-methyl-1,4-butylene, 3-methyl-1,2-pentylene, 2-ethyl-1,2-octylene and the like.

The term "lower-alkyl" means alkyl from 1 to 6 carbon atoms, inclusive, such as methyl, ethyl, propyl, butyl, pentyl, hexyl, and isomeric forms thereof. The term "lower-alkoxy" means alkoxy from 1 to 6 carbon atoms, inclusive, such as methoxy, ethoxy, propoxy, butoxy, pentyloxy, hexyloxy, and isomeric forms thereof. The term "halogen" is employed in its usually accepted sense as being inclusive of fluorine, chlorine, bromine, and iodine.

The term "radiation-sensitive" is used herein to indicate that the polymers of the invention can be activated and undergo molecular modification on exposure to thermal and/or actinic radiation.

In addition to their usefulness in chemically bonding basic dyestuffs to polymeric and other substrates and in producing continuous tone, non-silver containing images, the radiation-sensitive polymers of the invention, characterized by the recurring unit (I), are useful in converting normally hydrophobic polymer materials to hydrophilic materials and in the preparation of photoresist systems, as will be discussed more fully hereinafter.

DETAILED DESCRIPTION OF THE INVENTION

The novel radiation-sensitive polymers of the invention, characterized by the recurring unit of formula (I) are prepared conveniently from the appropriate copolymer of maleic anhydride with styrene or a lower-alkyl vinyl ether. The latter copolymers are well-known in the art and are characterized by a recurring unit having the following structure:

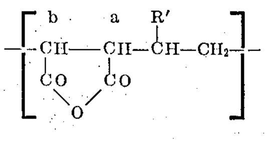
(II)

wherein R′ is as defined above.

In preparing the radiation-sensitive polymers of the invention the copolymer having recurring unit (II) is reacted with the appropriate alcohol having the formula:

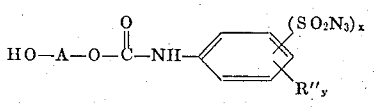
(III)

wherein A, R'', $x$ and $y$ are as hereinbefore defined. The reaction is carried out in the presence of a tertiary base and, advantageously, in the presence of an inert organic solvent. Examples of tertiary bases which can be used and which are generally present in the reaction mixture in an amount corresponding to at least 10 percent by weight of copolymer (III), are pyridine, N,N-dimethylaniline, triethylamine, N-methyl morpholine, N-methyl piperidine and the like. Pyridine is the preferred tertiary base and can, if desired, be used in sufficient amounts to act as solvent as well as catalyst for the reaction. Indeed, in a most preferred embodiment of the invention, the reaction is carried out with both reactants in solution in pyridine.

However, in place of the excess of pyridine as solvent, there may be used an inert organic solvent, i.e. an organic solvent which does not enter into reaction with either reactant or interfere in any way with the desired course of the reaction. Examples of inert organic solvents are acetonitrile, acetone, cyclohexanone, tetrahydrofuran, dioxane and the like.

The reaction is advantageously carried out at elevated temperatures, i.e. from about 50°C to about 150°C, in order to achieve a suitable rate of reaction. The course of the reaction can be followed by routine procedures, for example, by infrared spectroscopic examination of aliquots.

The relative molar proportions in which the reactants, namely the copolymer of recurring unit (II) and the alcohol (III), are employed determines the nature of the product. Thus, by using one molar proportion of alcohol (III) for each anhydride moiety (II) present in the starting copolymer there is obtained a product in which each of the original recurring units (II) present in the starting copolymer have been converted to units of the formula (I). By using less than one molar proportion of alcohol (III) for each anhydride moiety (II) present in the starting copolymer, there is obtained a product in which some, but not all, of the original recurring units (II) present in the starting copolymer have been converted to units of formula (I). The proportion of units (I) to units of formula (II) in the products in question will be directly proportional to the molar proportion of alcohol (III) employed in the above reaction.

Further by reacting the initial copolymer having units (II) with less than 1 molar proportion of alcohol (III) per anhydride group in said copolymer, and reacting the product so obtained with a second, but different, alcohol of formula (III), there can be obtained a polymer in which there are different R groups in some of the recurring units (I). Similarly, by employing a plurality of alcohol (III) in a reaction sequence of the above nature, there can be obtained a polymer in which a plurality of different R groups appear in the units (I).

When the reaction of the copolymer (II) and alcohol (or plurality of alcohols) of formula (III) is adjudged complete, the polymer of recurring unit (I) is isolated from the reaction product by procedures conventional in the art. For example, the inert organic solvent can be removed by distillation or, alternatively, a solvent in which the desired product is insoluble can be added to the reaction mixture. The desired product is then either left as a residue of the distillation or is precipitated from solution and isolated by filtration, decantation or like means. Purification can be effected by routine procedures such as solvent extraction, reprecipitation, chromatography and the like.

The reaction of the alcohol (III) with the polymer of recurring unit (II) results in opening of the anhydride ring in a proportion of, or in the whole of, the units of formula (II). The ring opening gives rise to one free carboxyl group and one esterified carboxyl group on adjacent carbon atoms designated a and b in Formula (II). It will be apparent to one skilled in the art that two possible structures can exist. In one structure the free carboxyl group is attached to the carbon atom designated *a* and the esterified carboxyl group is attached to the carbon atom designated b. In the other possible structure the positions of the free carboxyl group and the esterified carboxyl group are reversed. It will be further apparent to one skilled in the art that the radiation-sensitive polymer of the invention, which is obtained by the above reaction, will contain some recurring units having the one structure and other recurring units having the other structure. It is therefore to be understood that the general formula (I) shown above as characterizing the radiation-sensitive polymers of the invention is intended to embrace and represent all the possible structures within the polymer chain discussed above.

By virtue of the free carboxyl group in the recurring unit (I) of the radiation-sensitive polymers of the invention said polymers can be converted to the corresponding carboxylic acid salts by reaction with the appropriate base. As will be obvious to one skilled in the art, it is possible to convert only one, or several, or all the plurality of free carboxyl groups in the chain of the polymer of the invention to the corresponding salts. In general the greater the number of carboxyl units which are converted to salt form the greater the water solubility of the resulting polymer. The polymers of the invention in which one or more or all of the free carboxylic groups are converted to salts are included within the scope of the invention.

Illustratively, the radiation-sensitive polymers of the invention can be converted to their alkali metal, alkaline earth metal, ammonium and organic amine salts. "Alkali metal" is inclusive of sodium, potassium, lithium, rubidium, caesium and the like. "Alkaline earth metal" is inclusive of calcium, barium, strontium, magnesium and the like. "Organic amine" is inclusive of monoalkylamines such as methylamine, ethylamine, isopropylamine, secbutylamine, amylamine, hexylamine, isohexylamine, octylamine and the like; dialkylamines such as dimethylamine, N-ethyl-N-methylamine, N-methyl-N-propylamine, N-methyl-N-isobutylamine, diisopropylamine, N-ethyl-N-hexylamine, N-methyl-N-isooctylamine and the like; trialkylamines such as triethylamine, trimethylamine, N,N-dimethylpropylamine, N,N-dimethylhexylamine, N,N-diethylisobutylamine and the like; monoalkenylamines such as allylamine, 2-butenylamine, 3-hexenylamine, octenylamine and the like; dialkenylamines such as diallylamine, di-2-butenylamine, di-3-hexenylamine and the like; cycloalkylamines such as cyclopropylamine, cyclobutylamine, cyclopentylamine, cyclohexylamine and the like; N-alkyl-cycloalkylamines such as N-methylcyclopentylamine, N-ethylcyclopentylamine, N-propylcyclohexylamine and the like; cycloalkenylamines such as cyclopentenylamine, cyclohexenylamine and the like; aralkylamines such as benzylamine, phenethylamine, phenylpropylamine, benzhydrylamine and the like; N-alkyl-N-aralkylamines such as N-methylbenzylamine, N-propylbenzylamine, N-isobutylbenzylamine, N-octylbenzylamine, N-methylphenethylamine and the like; N,N-disubstituted aralkylamines such as N,N-dimethylbenzylamine, N-methylbenzhydrylamine, N,N-diethyl-3-phenylpropylamine, N-butyl-2-phenethylamine and the like; N-alkyl-arylamines such as N-methylaniline, N-isopropyl aniline, N-hexylaniline, N-methyl-p-toluidine, N-ethyl-m-xylidine, N-methylnaphthylamine, N-methylbenzidine, N,N'-dimethylbenzidine and the like, N,N-dialkylarylamines such as N,N-dimethylaniline, N,N-dibutylaniline, N-hexyl-N-methylaniline, N,N-dimethyltoluidine and the like; N-aralkyl-arylamines such as N-benzylaniline, N-phenethylaniline, N-benzhydrylaniline and the like; arylamines such as aniline, o-, m-, and P-toluidine, o-, m-, and p-xylidine, 1-naphthylamine, 2-naphthylamine and the like; alkanolamines such as ethanolamine, propanolamine, diethanolamine and the like; heterocyclic amines such as pyridine, quinoline, pyrrolidine, piperazine, morpholine, and alkyl-substituted pyrrolidines, piperidines, piperazines and morpholines, such as N-methylpyrrolidine, N-ethylpiperidine, N-methyl-N'-hexylpiperazine, N-methyl-morpholine and the like.

The above salts of the radiation-sensitive polymers of the invention can be prepared readily from the free carboxylic acid polymers of the invention by any of the methods conventionally used in the art for preparing carboxylic acid salts of this type. Illustratively, the free carboxylic acid polymer is dissolved in a watermiscible solvent such as acetone and treated with the appropriate amount of base to neutralize some or all of the free carboxyl groups in the polymer. In the preparation of the alkali metal, alkaline earth metal, or ammonium salts, the base is advantageously in the form of an aqueous solution of the corresponding hydroxide or carbonate or an alcohol solution of the corresponding alkoxide. In the case of the amine salts, the free amine is used as the base, advantageously as a solution in a water-miscible solvent. The resulting salt separates from solution particularly if there is little or no water present in the reaction mixture. Alternatively, the salt can be isolated by partial or complete evaporation of the solution or by addition of an appropriate salt in which the salt is insoluble.

It will be readily appreciated by one skilled in the art that part of the free carboxylic acid groups in the polymers of the invention can be converted to the corresponding salt using a first base, and some or all of the remaining free carboxylic acid groups in the partially neutralized polymer can be reacted with a second base and even with a third or fourth base so as to produce mixed salts of the polymers of the invention.

In general the molecular weight of the radiation sensitive polymers of the invention will be within the range of about 100,000 to about 2,000,000. Said polymers are, for the most part, resinous solids which are soluble, in the form of the free carboxylic acid, in polar solvents such as acetone, methyl ethyl ketone, tetrahydrofuran, dioxane and the like, from which they can be cast as films as will be described in more detail hereinafter. In the form of their salts, either partial or fully neutralized, the polymers of the invention are soluble in water and aqueous liquids and can be cast as films therefrom.

The maleic anhydride copolymers having the recurring unit (II) which are employed as starting materials in the process of the invention are well-known in the art; see, for example, Encyclopedia of Chemical Technology, edited by Kirk-Othmer, Interscience, N.Y., N.Y., 1965, Vol. 8, pages 685 et seq. and Vol. 11, page 652; U.S. Pat. Nos. 2,424,814 and 2,047,398. These copolymers can be obtained in a wide range of molecular weight, namely, from about 100,000 to about 1,250,000. As will be appreciated by one skilled in the art, the chain length of the starting maleic anhydride copolymer will remain unaffected by the conversion to the half ester polymer having recurring unit (I) although the overall molecular weight of the polymer will increase according to the number of anhydride moieties in the starting copolymer which are converted to half-ester moieties (I).

The alcohols (III), which are employed as starting materials in preparing the radiation-sensitive polymers (I) of the invention, are readily prepared by reacting the appropriate diol HO—A—OH, wherein A has the significance hereinbefore defined, with the appropriate isocyanatobenzenesulfonyl chloride of formula:

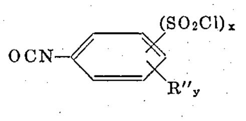

(IV)

wherein R'', $x$ and $y$ have the significance hereinbefore defined. There is thus obtained the corresponding sulfonylchloride intermediate having the formula:

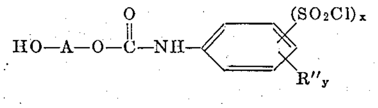

(V)

which intermediate is then reacted with sodium azide to convert the sulfonylchloride moiety to sulfonylazide and yield the desired alcohol (III).

In carrying out the above synthesis of the starting alcohol (III), the diol HO—A—OH and the isocyanatobenzenesulfonylchloride (IV) are brought together under conditions well-known in the art for the reaction of alcohols and isocyanates. Advantageously, the reactants are brought together at ambient temperatures, i.e. of the order of 20° to 25°C, in the presence of an inert organic solvent as hereinbefore defined. The reaction mixture is maintained below about 50°C, after the reactants have been brought together, in order to avoid reaction of the hydroxy groups in the diol with the sulfonyl halide moieties in the isocyanatosulfonyl chloride. Such reaction would clearly give rise to undesired byproducts.

If desired, the reaction between the diol and the isocyanatobenzenesulfonyl chloride (IV) can be carried out in the presence of a catalyst. Illustrative of such catalysts are those conventionally used in promoting the reaction between an hydroxyl group and an isocyanato group, such as, for example, triethylamine, triethylenediamine, N,N,N',N'-tetramethylethylenediamine, N,N,N', N'-tetraethylethylenediamine, N-methylmorpholine, N-ethylmorpholine, 1,1,3,3-tetramethylguanidine, N,N,N',N'-tetramethyl- 1,3-butanediamine, stannous octoate, dibutyltin dilaurate and the like.

The intermediate hydroxyalkyl carbamate (V) so prepared can, if desired, be isolated from the reaction mixture, for example, by evaporation of solvent, and purified, for example by recrystallization before conversion to the desired alcohol (III), However, it is generally not necesary to isolate the compound (V) prior to its conversion to the desired alcohol (III) and, indeed, in most instances the reaction product obtained in the reaction of the diol and the isocyanatosulfonyl chloride (IV) can be employed without any further treatment in the conversion to the alcohol (III). Illustratively, the reaction product obtained in the above process, comprising the compound (V), in solution in inert organic solvent, is treated, without any purification, with the appropriate amount of sodium azide, i.e. one mole of sodium azide for each $SO_2Cl$ group in the compound (V). The reaction is exothermic and is controlled, by cooling as required, to maintain the reaction temperature in the range of about 25°C to about 80°C. Sodium chloride is eliminated in the reaction and precipitated from the reaction mixture thereby serving as a ready guide to the progress of the reaction. The desired alcohol (III) can be separated from the reaction mixture by conventional procedures. For example, the sodium chloride, which has precipitated, is separated by filtration and the filtrate is evaporated to dryness. If a water miscible solvent is being used, the reaction mixture can be poured into excess water to precipitate the alcohol. The alcohol (III) so isolated can be purified by recrystallization or like procedures prior to being employed in the synthesis of the polymers of the invention.

The isocyanatobenzenesulfonyl chlorides (IV) which are employed as starting materials in the preparation of the alcohols (IXI) are, for the most part, well-known in the art and are obtained by phosgenation of the corresponding known aminobenzenesulfonic acids using conventional procedures such as that described by Alberino et al., J. Polymer Science, Vol. 5, pages 3212–13 1967.

As set forth previously the novel polymers of the invention having the recurring unit (I) are useful for a variety of purposes. For example, said polymers can be used as a means of chemically bonding basic dyestuffs to the surface of a variety of substrates such as paper, cotton, and like cellulosic materials, metal, glass and like as well as substrates which contain a plurality of —C—H bonds, such as polyolefins, polyurethanes, polyamides, polyesters, polyacetals and the like, which are not normally receptive to such dyestuffs. In this particular use of the polymers of the invention, a coating of the latter is applied to a part, or the whole, of the surface of the substrate to be treated. The coating is applied advantageously by dissolving the radiationsensitive polymer of the invention in a polar solvent, such as exemplified above, and spreading the solution on the substrate using the appropriate spreading means.

If desired the radiation-sensitive polymer of the invention can be employed in the form of a salt, as hereinbefore defined, in which case the polymer coating can be applied by using an aqueous solution of the salt. Advantageously, the polymer is employed as a partially neutralized salt, i.e. only a portion of the free carboxylic acid groups have been converted to the salt leaving free carboxylic groups in the polymer chain available for coupling with dyestuff in the latter stages of the process.

The coated substrate is then exposed to an approriate source of radiation, either thermal or actinic, necessary to activate the polymer of the invention. A wide variety of sources of thermal and/or actinic radiation can be employed. Such sources include carbon arcs, mercury vapor lamps, fluorescent lamps, argon glow lamps, photographic flood lamps, and tungsten lamps. Preferably the source of radiation is one which generates ultraviolet light of wavelength within the range of about 250 nm to about 390 nm.

If desired, the irradiation of the coated substrate can be performed "imagewise;" that is to say, a negative of an image to be produced on the surface of the substrate is interposed between the coated substrate and the source of radiation. The radiation-sensitive polymer in those portions of the coated substrate receiving the radiation is activated and becomes chemically bonded to the surface of the substrate. The chemical bonding of the radiation-sensitive polymer to the substrate is believed to take place by degradation of the sulfonazido group or groups in the moieties (I) to yield a nitrene radical which enters into interaction with —C—H bonds in the substrate. This suggested reaction mechanism is, however, offered by way of explanation only and is not intended in any way to define or limit the scope of the present invention.

When the coating of the polymer of the invention has been bonded to the substrate in the above manner, the surface of the substrate, or in the case of imagewise irradiation, that portion of it bearing the irradiated image, has directly bonded to it a series of free carboxyl groups in the recurring units (I). The resulting image can be developed by removal of unchanged polymer (I) from unirradiated areas and treatment of the irradiated suface with a basic dye thereby achieving chemical bonding of the basic dyestuff to the surface of the substrate via said free carboxyl groups.

The removal of the unchanged polymer from the nonirradiated areas can be accomplished, in the case where the initial polymer was employed in the free carboxylic acid form, by washing with a polar solvent, advantageously the same solvent as was used in coating the substrate originally. Alternatively, and preferably, the unchanged polymer in the free carboxylic acid form is removed by washing with an aqueous solution of a base such as alkali metal hydroxide, alkali metal carbonate, ammonium hydroxide, alkaline earth metal carbonate and the like. The unchanged polymer is removed as an aqueous solution of its salt and, if desired, the free carboxylic acid form can be recovered therefrom for re-use by acidification of the solution.

Where the polymer (I) was applied to the substrate in the form of a water-soluble salt, the removal of unchanged polymer after imagewise irradiation is effected readily by washing with water. The polymer can be recovered as such or in the free carboxylic acid form from the aqueous washings by acidification and isolation of the resulting precipitate.

The application of the dyestuff to the treated substrate, after development if required, can be accomplished in any conventional manner, as by dipping in a bath of dyestuff, or application of dye by roller, sponge and the like.

The term "basic dyestuff" is one well-recognized in the art as characterizing a particular class of dyestuffs, namely, those which will react with an acid (mineral acid or organic carboxylic acid) to form a corresponding salt. A comprehensive list of basic dyestuffs and a description of their properties is set forth in Colour Index, Second Edition, Vol 1, pages 1617–1653, 1956, published jointly by The Society of Dyers and Colourists, Bradford, Yorkshire, England, and The American Association of Textile Chemists and Colorists, Lowell, Massachusetts. Any of the basic dyestuffs set forth in said Colour Index can be employed in the process and compositions of the invention. Generally said basic dyestuffs are employed in the form of aqueous solutions.

Typical of said basic dyestuffs are: crystal violet, methylene blue, malachite green, auramine O, basic fuchsin, Aniline Yellow, Disperse Orange 3, Disperse Black 7, Disperse Red 13, Disperse Red 9, Vat Red 33, Mordant Violet 6, Phenylene blue, Disperse Orange 11, Natural Orange 6, Natural Brown 7, and Natural Yellow 12.

As will be readily appreciated by one skilled in the art, the above process, for chemically bonding basic dyestuffs to polymeric substrates not normally receptive to such dyes, can be adapted to a variety of dyeing and/or printing techniques. For example, the printing of advertising and like matter on polymer films can be accomplished readily on a continuous basis by passing a continuous sheet of said film successively through zones in which the film is coated with a radiation-sensitive polymer of the invention, coated film is exposed imagewise to activating radiation from an appropriate source, the unexposed coating is removed using any of the procedures described above, and finally, the film with image bonded in place is contacted with basic dye.

In an alternative, but less preferred, method of employing the novel polymers of the invention to chemically bond dyes to substrates, the novel polymer of the invention is treated with the dyestuff in a preliminary step and the radiation-sensitive polymer, with dye incorporated therein, is applied as a coating to the surface of the substrate to be treated. The coated substrate is then exposed to appropriate radiation to effect bonding of the radiation-sensitive polymer (with dye already attached) to the substrate. The exposure to radiation can be done imagewise, if desired, and the unexposed radiation-sensitive polymer + dye can be eluted from the exposed surface leaving the required image bonded to the substrate.

In another, related, use of the novel radiation-sensitive polymers of the invention having the recurring unit (I), the latter are applied in the form of a coating to a substrate and bonded thereto by irradiation as described above. The surface of the substrate is thereby rendered hydrophilic by virtue of the carboxylic moieties present in the polymer. If desired, the carboxylic acid moieties can be converted to the corresponding alkali metal or alkaline earth metal, or ammonium salt phase to increase or modify the hydrophilic properties. The above procedure represents a very convenient method of rendering hydrophilic the surfaces of substrates such as polyolefins and the like which are normally hydrophobic.

In yet another use of the novel radiation-sensitive polymers of the invention having the recurring unit (I), the latter are employed as the components of a photoresist system. For example, the said polymers can be used in the photographic reproduction and printing arts to produce printed masters as follows. The polymer (I) is dissolved in a polar organic solvent such as those exemplified above or, in the case of a salt of polymer (I), the salt is dissolved in aqueous or polar solvent solution, and cast as a film on an appropriate substrate such as paper, metal and the like film supports normally employed in the reproduction art. A negative of the image to be reproduced, e.g. lined, screened or half-tone negatives, or diapositives, is interposed between the supported film so obtained and a source capable of producing radiation necessary to activate the radiation-sensitive polymer. The polymer in those portions of the supported film exposed to the radiation is thereby bonded to the substrate. The polymer in the unexposed portions of the film can then be removed, using any of the techniques described above, leaving the exposed polymer bonded to the substrate in the form of a positive image corresponding to the negative used in the irradiation step. Said image has high resistance to solvents and mechanical stresses and can be used to advantages as a master from which to reproduce copies of the original.

In a similar manner photoresist systems produced from the radiation sensitive polymers of the invention can be used in other photoresist applications such as in the printing of microcircuitry and related applications which involve production of an image, in the form of bonded polymer, on a metal substrate such as copper, followed by removal, in part or in toto, of the uncoated metal by etching. Essentially the same technique as that described above in the production of printed masters is employed in the formation of the polymer image on the substrates.

In any of the irradiation processes described above in which the radiation-sensitive polymers of the invention are bonded to substrates by exposure to appropriate radiation, there can be employed a sensitizer. The latter can be any of the sensitizers known in the art as useful in the enhancing the sensitivity to radiation of azido and sulfonazido groups. Illustrative of such sensitizers are triphenylmethane dyes, aromatic ketones such as Michler's ketone, dimethylaminobenzaldehyde, 4-methoxy-acetophenone, 2-methoxyxanthane, N-phenylthioacridone, 1,2-benzanthraquinone, 1,81,8-phthaloylnaphthalene, -naphthoquinone and the like, 5-nitroacenaphthene, pyrene, acridine, 2-nitrofluorene, 1-nitropyrene, the pyrylium thiapyrylium and selenopyrylium dye salts disclosed in U.S. Pat. No. 3,475,176; and the various heterocyclic sensitizers listed in U.S. Pat. Nos. 3,528,812, 3,528,813, and 3,528,814.

The water-soluble salts of the radiation-sensitive polymers of the invention are additionally useful in that they can be used as electrolytes in the electrodeposition of polymer coatings on metals and the like in accordance with procedures well-known in the art.

The following preparations and examples describe the manner and process of making and using the invention and set forth the best mode contemplated by the inventors of carrying out the invention but are not to be construed as limiting.

PREPARATION 1

To 50.4 gms (0.8 mole) of ethylene glycol in 500 ml of acetonitrile is added a solution of 43.2 gms (0.2 mole) of 4-isocyanatobenzenesulfonyl chloride (prepared by the method of L. Alberino et al., supra.). The addition is accomplished over a period of 10 minutes with stirring and cooling at circa 2°C to 8°C, and the mixture is then allowed to stand at room temperature until the NCO band stretching has disappeared in the infrared spectrum of an aliquot of the reaction mixture (approximately 30o minutes). To the mixture so obtained is added 13 gms (0.2 mole) sodium azide and the resulting mixture is stirred for 1 hour at room temperature. The sodium chloride which has precipitated is removed by filtration and about 80 percent of solvent is evaporated from the filtrate under vacuum. Water is added to the remaining filtrate to precipitate the water insoluble product. The latter is separated by filtration, washed with water, and dried under vacuum at room temperature. There is thus obtained 52 gms (91 percent theoretical yield) of a white crystalline powder identified by infrared and NMR spectrometric examination as 2-hydroxyethyl 4-azidosulfonylcarbanilate and having a melting point of 115°C to 118°C. Recrystallization from acetonitrile gave white crystals having a melting point of 120°C to 122°C (Fisher-Johns method); 124°C (DSC method).

| | |
|---|---|
| Analysis: Calculated $C_9H_{10}N_4O_5S$: | C = 37.76; H = 3.46 |
| Found: | C = 37.60; H = 3.73 |

Using the above procedure but replacing ethylene glycol by 1,3-propylene glycol, 1,4-butanediol, 1,3-pentanediol, 2,3-hexanediol, 1,5-heptanediol, and 2,2-dimethyl-1,6-hexanediol, 2,5-diethyl-1,6-hexanediol there are obtained:

3-hydroxypropyl,
4-hydroxybutyl,
3-hydroxypentyl,
3-hdyroxy-2-methylpentyl,
5-hydroxyheptyl,
6-hydroxy-2,2-dimethylhexyl, and
6-hydroxy-2,5-diethylhexyl 4-azidosulfonylcarbanilate, respectively.

EXAMPLE 1

A mixture of 0.56 g (0.002 mole) of 2-hydroxyethyl 4-azidosulfonylcarbanilate and 1.56 g of a poly(maleic anhydride co-methylvinyl ether) [having an average molecular weight of 250,000: Gantrez AN 119] was dissolved in 25 ml of anhydrous pyridine and the mixture was heated at 100°C for 3 hours. The resulting mixture was evaporated to dryness and the residue was dissolved in 25 ml of a mixture of equal parts of acetone and methanol. The solution was poured into an equal volume of aqueous 2 N hydrochloric acid. A brown mass was precipitated and the supernatant liquid was decanted therefrom. The brown mass was again dissolved in about 25 ml of a mixture of acetone and methanol. The polymer was reprecipitated from said solution by addition of 50 ml of carbon tetrachloride. The brown precipitate was isolated by decantation and dried. There was thus obtained a photosensitive modified copolymer of maleic anhydride and methylvinyl ether in which 1 in 5 of the recurring units in the chain was a moiety represented by the formula:

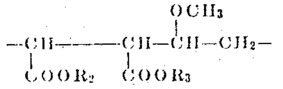

wherein one of $R_2$ and $R_3$ is hydrogen and the other is

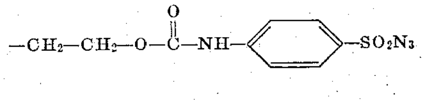

A film was cast by dissolving a small sample of the above polymer in acetone and pouring the solution on a quartz plate. The plate was irradiated by exposure for 5 minutes to a mercury arc lamp (Hanovia type SH). When the irradiation was complete, the film was found to be insoluble in acetone and other polar solvents.

Using the above procedure but replacing 2-hydroxyethyl 4-azidosulfonylcarbanilate by equivalent amounts of 3-hydroxypropyl, 4-hydroxybutyl, 3-hydroxypentyl, 3-hydroxy-2-methylpentyl, 5-hydroxyheptyl, 6-hydroxy-2,2-dimethylhexyl, and 6-hydroxy-2,5-diethylhexyl 4-azidosulfonylcarbanilate, there are obtained the correspondingly modified copolymers of maleic anhydride and methylvinyl ether.

EXAMPLE 2

The procedure in EXAMPLE 1 was repeated exactly as described but the amount of 2-hydroxyethyl 4-azidosulfonyl carbanilate was increased to 1.44 g. There was thus obtained a photosensitive modified copolymer of maleic anhydride and methylvinyl ether in which 1 in 2 of the recurring units was represented by the structure

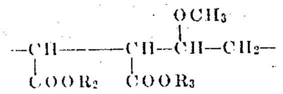

wherein one of $R_2$ and $R_3$ is hydrogen and the other is

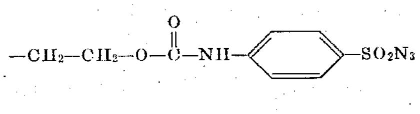

EXAMPLE 3

Using the procedure described in EXAMPLE 1 but replacing the poly(maleic anhydride comethylvinyl ether) there employed by a poly(maleic anhydride co-styrene) having an average molecular weight of 100,000, there was obtained the corresponding modified poly)maleic anhydride co-styrene) in which approximately 1 in every 5 recurring units had a structure represented by the formula:

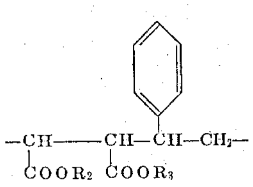

wherein one of $R_2$ and $R_3$ is hydrogen and the other is

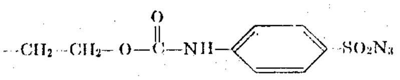

Similarly, using the procedure described in EXAMPLE 1, but replacing the poly(maleic anhydride co-methylvinyl ether) there employed by a poly(maleic anhydride co-butylvinyl ether) or a poly(maleic anhydride co-hexylvinyl ether), there were obtained the correspondingly modified photosensitive polymers of the invention in which approximately 1 out of every 5 recurring units had a structure represented by the formulae:

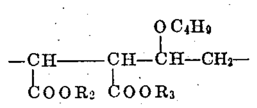

and

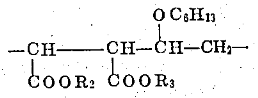

wherein one of $R_2$ and $R_3$ in each case is hydrogen and the other is

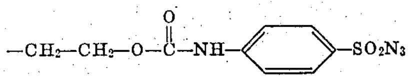

respectively.

EXAMPLE 4

Films of thickness of 0.5 $\mu$ were cast from the light-sensitive modified copolymers of EXAMPLES 1 and 2, by preparing a 5 percent *w/w* solution of each of said polymers in a mixture of acetone and N,N-dimethylformamide (5:1 by volume) and casting the solutions on a series of quartz plates (2 × 2 × 1/16inch). The films so obtained were exposed for varying periods of time (10 seconds to 6 minutes) to the radiation received at a distance of 15 cm from a mercury arc lamp (Hanovia type SH). The amount of insoluble polymer formed after any given exposure was determined by measuring the absorbance of the film at 240 nm before and after the irradiation. The ratio of the two absorbances represents the relative amount of insoluble formed. The results obtained were as follows and indicate the high rate at which said polymers are activated by the radiation:

| Light Sensitive Polymer | Time of Exposure | % Insoluble Polymer |
|---|---|---|
| Polymer of EXAMPLE 1 | 10 seconds | 49 |
| | 30 seconds | 55 |
| | 60 seconds | 63 |
| | 360 seconds | 85 |
| Polymer of EXAMPLE 2 | 10 seconds | 83 |
| | 30 seconds | 86 |
| | 60 seconds | 87 |
| | 360 seconds | 91 |

EXAMPLE 5

Films were cast from the light-sensitive modified copolymers of EXAMPLE 2, on polyethylene foil as substrate. On top of the film was placed a master representing a negative of a pattern of dots to be reproduced. The films were exposed for 2 minutes to the light emitted by a Hanovia type SH mercury arc, the plane of exposure being at a distance of 15 cm from the lamp. The exposed films were developed by immersion with agitation for 1 minute in a mixture of acetone and N,N-dimethylformamide (100:1 by volume). Green-colored images were produced by imersion of the exposed films for 1 minute in a hot dye bath (circa 80°C) containing 3 percent Malachite green and 5 percent sodium chloride. The film was thereafter rinsed with water.

The above procedure was repeated but replacing the Malachite green bath by a bath of Nile Blue A and a bath of Crystal Violet to produce corresponding blue and purple images.

EXAMPLE 6

A mixture of 25 g (0.16 mol. equivalents) of a poly(-maleic anhydride co-methylvinyl ether) having an average molecular weight of 250,000 [Gantrez AN 119], 22.9 g (0.087 mole) of 2-hydroxyethyl 4-azidosulfonyl carbanilate and 8.1 g (0.08 mole) triethylamine in 400 ml of dry acetone was stirred at room temperature (circa 25°C) for 24 hours. The resulting viscous solution was evaporated to dryness under reduced pressure and dried in vacuo. There was thus obtained the triethylamine salt of a photosensitive modified copolymer of maleic anhydride and methylvinyl ether in which 1 in 2 of the recurring units in the chain was a moiety represented by the formula

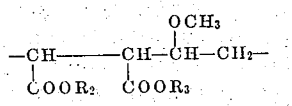

wherein one of $R_2$ and $R_3$ is protonated triethylamine and the other is

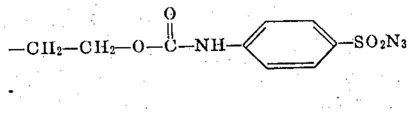

Films were deposited on both glass and polyethylene using a solution of the above triethylamine salt in a mixture of acetone and tetrahydrofuran. The coated substrates, in both cases, were covered with negatives of an image to be reproduced, and then exposed to the light of a 200W super high pressure mercury lamp type USH 205D. Exposure was for 75 seconds with the plane of exposure at a distance of 50 cm from the lamp. After irradiation the image deposited on the substrate was developed by washing with water to remove the unexposed photosensitive film. The aqueous solution so recovered was acidified to regenerate the unchanged photosensitive polymer. The resulting developed image was then immersed for 1 minute in a hot dye bath (circa 80°C) containing 3 percent Malachite green and 5 % sodium chloride. The film was thereafter rinsed with water and the image produced was found to be very clear with fine resolution.

EXAMPLE 7

A solution of 1 g of the photosensitive modified copolymer, prepared as decribed in EXAMPLE 1, in 20 ml of a mixture of acetone and ethanol was treated slowly, with vigorous agitation, with aqueous 2N sodium hydroxide solution until the resulting mixture remained permanently alkaline to litmus. The resulting mixture was diluted with acetone and the precipitated sodium salt of the photosensitive modified copolymer was isolated by filtration. The above procedure was repeated except that the amount of sodium hydroxide solution was reduced to one-half of that used above. There was thus obtained a photosensitive modified copolymer of the invention in which 1 in 2 of the free carboxylic groups had been converted to the sodium salt.

In similar manner, but replacing the aqueous sodium hydroxide solution with potassium hydroxide, lithium hydroxide, calcium hydroxide, or ammonium hydroxides, there are obtained the corresponding potassium, lithium, calcium, and ammonium salts of the photosensitive modified copolymer of EXAMPLE 1.

Similarly, using the above procedure, any of the other photosensitive polymers of the invention can be converted to the corresponding alkali metal, alkaline earth metal, or ammonium salt.

EXAMPLE 8

A film was cast on a polyethylene plate using an acetone solution of the photosensitive modified copolymer of EXAMPLE 1. The resulting plate was covered with a negative of an image to be reproduced and the plate so covered was exposed to the light of a 200W super high pressure mercury lamp type USH 205D. Exposure was for 75 seconds with the plane of exposure at a distance of 50 cm from the lamp. After irradiation the image deposited on the substrate was developed by washing with an aqueous 5 percent *w/v* solution of sodium bicarbonate. The wash solution was acidified by addition of concentrated hydrochloric acid to reprecipitate the unchanged photosensitive polymer. The developed image on the polyethylene plate was then immersed for one minute in a hot dye bath (circa 80°C) containing 3 percent Malachite green and 5 percent sodium chloride. The plate was then rinsed with water and the image thereon was found to be clear with high resolution.

The above process was repeated but replacing the aqueous sodium carbonate solution employed in the development stage by one of aqueous triethylamine solution, aqueous ammonium hydroxide solution, and aqueous potassium carbonate solution.

We claim:

1. A process for chemically bonding a basic dye to a substrate containing a plurality of C-H bonds which substrate is not normally receptive to dyestuffs which process comprises:

a. applying to the said substrate a radiation sensitive polymer characterized by the recurring unit:

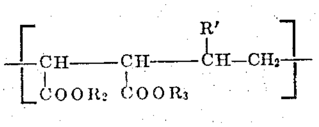

wherein R′ is selected from the class consisting of lower-alkoxy and phenyl and wherein one of $R_2$ and $R_3$ represents hydrogen and the other of $R_2$ and $R_3$ represents a group having the formula:

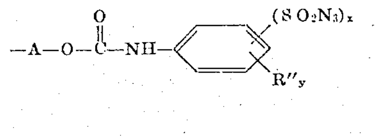

wherein A is alkylene having from 2 to 6 carbon atoms separating the valencies and a total carbon atom content of from 2 to 10, R″ is selected from the class consisting of lower-alkyl and halogen, $x$ is an integer from 1 to 2, $y$ is an integer from 0 to 2, provided that $x + y$ is not greater than 3, and the $SO_2N_3$ group is in any of the positions 3, 4, and 5 in the phenyl nucleus to which it is attached, and at least one of the said positions 3, 4, and 5 is unsubstituted;

b. exposing the treated substrate to appropriate radiation to activate said light and heat-sensitive polymer; and c. contacting the treated polymer with a basic dye.

2. A process according to claim 1, wherein in step (b) the treated substrate is exposed to radiation in selected areas only and the unexposed light- and heat-sensitive polymer is removed from the combination prior to carrying out step (c).

3. A process according to claim 2 wherein the removal of the unexposed light- and heat-sensitive polymer is accomplished by dissolving said unexposed polymer in an aqueous solution of a base.

4. A process according to claim 2 wherein sufficient of the free carboxylic acid groups in the starting light- and heat-sensitive polymer have been converted to the corresponding salt to render said polymer water-soluble prior to its application to the substrate, and, after the irradiation step is complete, the unexposed light- and heat-sensitive polymer is removed from the combination by washing with water.

5. A process according to claim 1 wherein the substrate not normally receptive to dyestuffs is a polyolefin.

6. A process according to claim 1 wherein the light- and heat sensitive polymer has a recurring unit having a formula selected from:

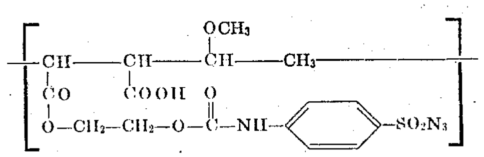

and

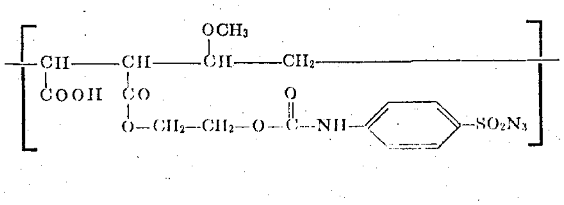

and mixtures thereof.

7. A process for chemically bonding a dyestuff to a polymeric substrate which contains a plurality of C—H bonds and is not normally receptive to said dyestuff which process comprises:

a. applying to said substrate a coating of a light- and heat-sensitive polymer characterized by the recurring unit:

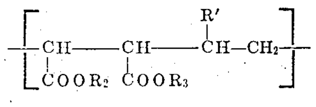

wherein R′ is selected from the class consisting of lower-alkoxy and phenyl and wherein one of $R_2$ and $R_3$ represents hydrogen and the other of $R_2$ and $R_3$ represents a group having the formula:

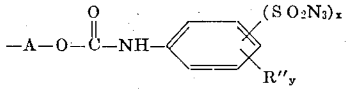

wherein A is alkylene having from 2 to 6 carbon atoms separating the valencies and a total carbon atom content of from 2 to 10,
R″ is selected from the class consisting of lower-alkylene and halogen, x is an integer from 1 to 2, $y$ is an integer from 0 to 2, provided that $x+y$ is not greater than 3, and the $SO_2N_3$ group is in any of positions 3, 4, and 5 in the phenyl nucleus to which it is attached, and at least one of the said positions 3, 4, and 5 is unsubstituted;

b. exposing said coated substrate to appropriate radiation to activate said light- and heat-sensitive polymer; and c. contacting said coated, irradiated substrate with a basic dye.

8. The process of claim 7 wherein the irradiation in step (b) is carried out imagewise and, after said exposure, the image is developed by dissolving out the unexposed coating of light- and heat-sensitive polymer.

9. The process of claim 8 wherein the removal of the unexposed coating of light- and heat-sensitive polymer is accomplished by dissolving said unexposed coating in an aqueous solution of a base.

10. A process according to claim 8 wherein sufficient of the free carboxylic acid groups in the starting light- and heat-sensitive polymer have been converted to the corresponding salt to render said polymer water-soluble prior to its application to the substrate, and, after the irradiation step is complete, the unexposed light- and heat-sensitive polymer is removed from the combination by washing with water.

11. The process of claim 7 wherein the polymeric substrate is polyolefin.

12. The process of claim 7 wherein the polyolefinic substrate is in the form of a film.

* * * * *

UNITED STATES PATENT OFFICE

CERTIFICATE OF CORRECTION

Patent No. 3,854,946 Dated December 17, 1974

Inventor(s) Adnan A.R. Sayigh, Fred A. Stuber and Henri Ulrich

It is certified that error appears in the above-identified patent and that said Letters Patent are hereby corrected as shown below:

| | |
|---|---|
| Column 8, line 37: | Should read: |
| suface with | surface with |
| Column 10, lines 21 and 22: | Should read: |
| to advantages | to advantage |
| Column 10, lines 45 and 46: | Should read: |
| 1,81,8-phthaloylnaphthalene | 1,8-phthaloylnaphthalene |
| Column 10, line 46: | Should read: |
| -naphthoquinone | α-naphthoquinone |
| Column 11, line 6: | Should read: |
| 30∘ minutes). | 30 minutes). |

ORM PO-1050 (10-69)

USCOMM-DC 60376-P69
☆ U.S. GOVERNMENT PRINTING OFFICE : 1969 O—366-334

UNITED STATES PATENT OFFICE
CERTIFICATE OF CORRECTION

Patent No. 3,854,946 Dated December 17, 1974

Inventor(s) Adnan A.R. Sayigh, Fred A. Stuber and Henri Ulrich

It is certified that error appears in the above-identified patent and that said Letters Patent are hereby corrected as shown below:

Column 16, Claim 6, lines 51-56:

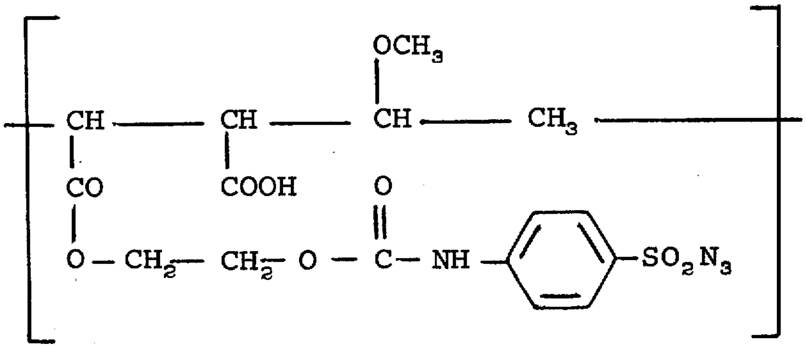

Should read:

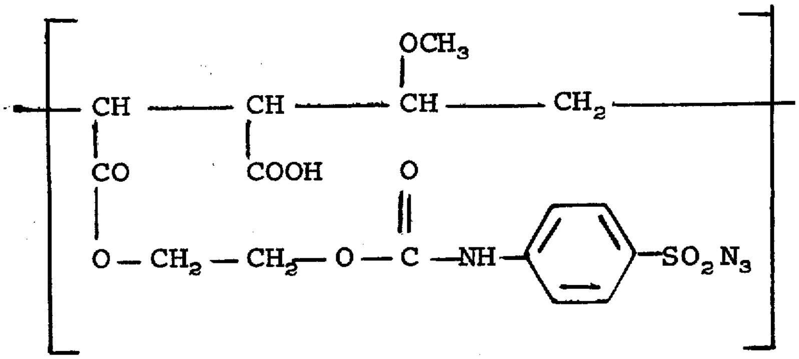

Signed and sealed this 15th day of April 1975.

(SEAL)
Attest:

RUTH C. MASON
Attesting Officer

C. MARSHALL DANN
Commissioner of Patents
and Trademarks